United States Patent
Suzuki et al.

(10) Patent No.: US 6,707,156 B2
(45) Date of Patent: Mar. 16, 2004

(54) SEMICONDUCTOR DEVICE WITH MULTILEVEL WIRING LAYERS

(75) Inventors: Takashi Suzuki, Kawasaki (JP);
Satoshi Otsuka, Kawasaki (JP);
Tsutomu Hosoda, Kawasaki (JP);
Hirofumi Watatani, Kawasaki (JP);
Shun-ichi Fukuyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/352,029

(22) Filed: Jan. 28, 2003

(65) Prior Publication Data
US 2003/0214041 A1 Nov. 20, 2003

(30) Foreign Application Priority Data
May 20, 2002 (JP) ........................................ 2002-145284

(51) Int. Cl.⁷ .......................... H01L 23/48; H01L 23/52; H01L 29/40
(52) U.S. Cl. ........................................ 257/758; 257/759
(58) Field of Search ................................ 257/758, 759, 257/760, 762, 765; 438/622, 623, 624, 625, 687, 688

(56) References Cited

U.S. PATENT DOCUMENTS 5,939,789 A * 8/1999 Kawai et al. ................ 257/758
6,211,569 B1 * 4/2001 Lou ............................. 257/758
6,452,274 B1 * 9/2002 Hasegawa et al. ........... 257/758
6,534,870 B1 * 3/2003 Shimooka et al. ........... 257/759
6,559,548 B1 * 5/2003 Matsunaga et al. .......... 257/774

* cited by examiner

Primary Examiner—Long Pham
Assistant Examiner—Hoai Pham
(74) Attorney, Agent, or Firm—Westerman, Hattori, Daniels & Adrian, LLP

(57) ABSTRACT

A semiconductor device has: a semiconductor substrate; a number of semiconductor elements formed on the semiconductor substrate; a plurality of lower level wiring layers electrically connected to the semiconductor elements; a plurality of first insulating layers electrically separating the lower level wiring layers and having a first dielectric constant; a plurality of middle level wiring layers electrically connected to the lower level wiring layers; a plurality of second insulating layers electrically separating the middle level wiring layers and having a second dielectric constant larger than the first dielectric constant; a plurality of upper level wiring layers electrically connected to the middle level wiring layers; a plurality of third insulating layers electrically separating the upper level wiring layers and having a third dielectric constant larger than the second dielectric constant. A multilevel wiring structure is provided which has a high performance and a high reliability.

20 Claims, 8 Drawing Sheets

SEMICONDUCTOR DEVICE WITH MULTILEVEL WIRING LAYERS

CROSS REFERENCE TO RELATED APPLICATION

This application is based on Japanese Patent Application No. 2002-145284, filed on May 20, 2002, the entire contents of which are incorporated herein by reference.

BACKGROUND OF THE INVENTION

A) Field of the Invention

The present invention relates to a semiconductor device and more particularly to a semiconductor device having multilevel wiring layers.

B) Description of the Related Art

As semiconductor integrated circuit devices are highly integrated, the wiring scale of each device increases one generation after another. According to the road map, the total wiring length of a typical semiconductor chip in the 0.18 $\mu$m generation of 1999 was about 500 m and the number of wiring layers was three or four. The total wiring length of a typical semiconductor chip in the 0.10 $\mu$m next generation will be about 4 km and the number of wiring layers will be about ten. The total wiring length of a typical semiconductor chip of the 0.05 $\mu$m generation in about ten years may be over 200 km.

Both high integration and high speed of semiconductor integrated circuits are desired. For the high speed operation, it is desired to lower the wiring resistance and the parasitic capacitance. In order to lower the wiring resistance, aluminum (Al) wiring has been replaced with copper (Cu) wiring. It is difficult to use wiring material having a resistivity lower than Cu. When reduction of the wiring resistance reaches near its limit, it becomes necessary to lower the parasitic capacitance of wiring in order to realize high speed operation.

The parasitic capacitance of wiring is dependent on the dielectric constant of insulating layers dielectrically separating the wiring. Fluorine-doped silicon (FSG having a dielectric constant $\in$ of about 3.7) is used in place of undoped silicon oxide (USG), phosphorous doped silicon oxide (PSG), boron and phosphorous doped silicon oxide (BPSG) respectively having a dielectric constant $\in$ of about 4.1. Organic insulating material having a much lower dielectric constant (registered trademarks SiLK, FLARE and the like) is also used. Porous material (such as porous silicon oxide) realizing a further lowered dielectric constant has been proposed.

Figure 8A:
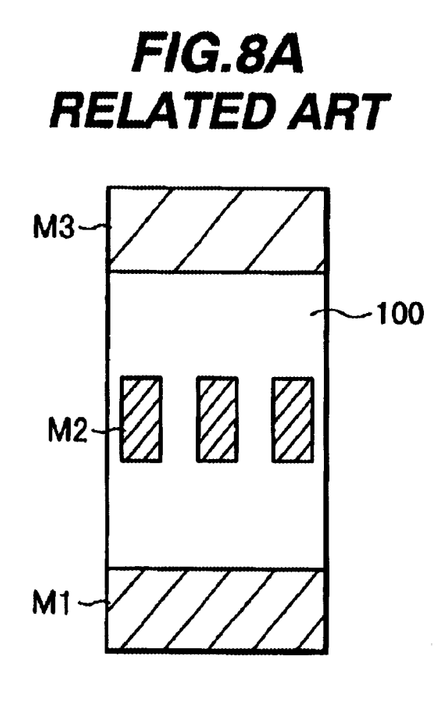
FIGS. 8A, 8B and 8C are cross sectional views showing examples of a wiring structure according to prior art.
Figure 8B:
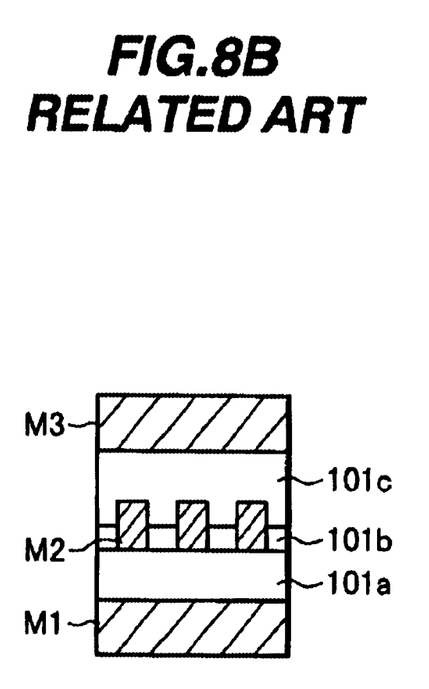
Figure 8C:
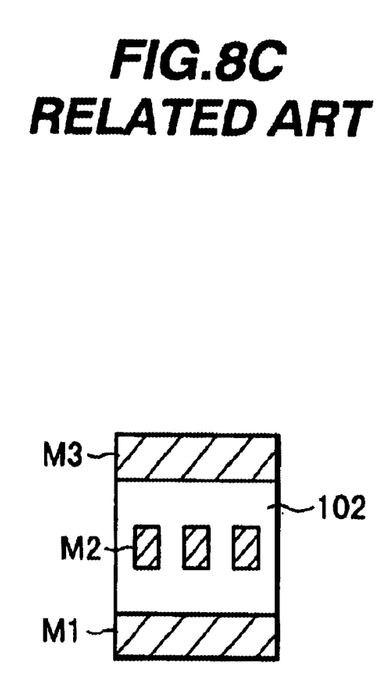

FIGS. 8A, 8B and 8C show examples of a wiring structure according to prior art.

FIG. 8A shows an example of a wiring layer in the 0.18 $\mu$m generation. Between a first wiring layer M1 and a third wiring layer M3, a second wiring layer M2 buried in a silicon oxide layer 100 is disposed. For example, the line width of the second wiring layer M2 is 260 nm and the height thereof is 545 nm. The distance between the first and second wiring layers M1 and M2 is, for example, about 750 nm. The sheet resistance of the wiring layer M2 is 91 m$\Omega$/$\square$, and the parasitic capacitance is 253 fF/mm (0.137 fF/grid). The dielectric constant $\in$ of the silicon oxide layer 100 is about 4.1.

FIG. 8B shows an example of a wiring layer in the 0.13 $\mu$m generation. Between a first wiring layer M1 and a third wiring layer M3, a second wiring layer M2 is disposed. Insulating films burying the second wiring layer M2 include an insulating layer 101a of silicon oxide under the second wiring layer, an organic insulating layer 101b having a dielectric constant of about 2.7 and laterally separating the main regions of the second wiring layer, and an insulating layer 101c of silicon oxide disposed on the organic insulating layer. For example, the line width of the second wiring layer M2 is about 200 nm and the height thereof is about 275 nm. The distance between the first and second wiring layers M1 and M2 is, for example, about 350 nm. The sheet resistance of the wiring layer M2 is about 90 m$\Omega$/$\square$, and the parasitic capacitance is about 214 fF/mm (0.086 fF/grid).

FIG. 8C shows an example of a wiring layer in the 0.1 $\mu$m generation. Between a first wiring layer M1 and a third wiring layer M3, a second wiring layer M2 is disposed. The second wiring layer M2 is buried in an organic insulating layer 102 having a low dielectric constant of about 2.7. For example, the line width of the second wiring layer M2 is about 140 nm and the height thereof is about 250 nm. The distance between the first and second wiring layers M1 and M2 is, for example, about 300 nm. The sheet resistance of the wiring layer M2 is about 95 m$\Omega$/$\square$, and the parasitic capacitance is about 185 fF/mm (0.052 fF/grid).

The parasitic capacitance of wiring can be lowered by using insulating material having a low dielectric constant. However, the line width of a wiring layer in a semiconductor integrated circuit device becomes wider and the height thereof becomes higher in the upper level wiring layer.

The main role of lower level wiring lines is transistor signal lines and the like, and the pitch of wiring lines is small. The smaller the parasitic capacitance of wiring lines is, the better it is for high speed operation. To this end, low dielectric constant insulating material such as an organic film is used.

The main role of upper level wiring lines is power supply lines. High speed operation is not required but heat radiation and workability have a priority over the high speed operation. These requirements can be met and high reliability can be realized by using insulating films made of mainly silicon oxide which has been widely used conventionally. By using different insulating materials for upper and lower wiring lines, a high performance of semiconductor integrated circuit devices can be expected.

A variety of makers have proposed low dielectric constant films such as organic films and inorganic films. These low dielectric constant materials have physical constants very different from those of insulating material made of mainly silicon oxide.

If insulating layers having very different physical constants are laminated, cracks or peeling is likely to be formed between the layers.

SUMMARY OF THE INVENTION

An object of this invention is to provide a semiconductor device having multilevel wiring layers with a high performance and a high reliability.

Another object of the invention is to provide a semiconductor device capable of relaxing stress in a multilevel wiring layer structure.

According to one aspect of the present invention, there is provided a semiconductor device comprising: a semiconductor substrate; a number of semiconductor elements formed on the semiconductor substrate; a plurality of lower level wiring layers electrically connected to the semiconductor elements; a plurality of first insulating layers electrically separating the lower level wiring layers and having a first dielectric constant; a plurality of middle level wiring layers electrically connected to the lower level wiring layers; a plurality of second insulating layers electrically separating the middle level wiring layers and having a second dielectric constant larger than the first dielectric constant; a plurality of upper level wiring layers electrically connected to the middle level wiring layers; a plurality of third insulating layers electrically separating the upper level wiring layers and having a third dielectric constant larger than the second dielectric constant.

According to another aspect of the present invention, there is provided a semiconductor device comprising: a semiconductor substrate; a number of semiconductor elements formed on the semiconductor substrate; a plurality of lower level wiring layers electrically connected to the semiconductor elements; a plurality of middle level wiring layers electrically connected to the lower level wiring layers; a plurality of upper level wiring layers electrically connected to the middle level wiring layers; a plurality of first insulating layers electrically separating the lower level wiring layers and having a first physical constant; a plurality of third insulating layers electrically separating the upper level wiring layers and having a third physical constant different from the first physical constant; a plurality of second insulating layers electrically separating the middle level wiring layers and having a second physical constant having an intermediate value between the first and third physical constants.

With these configurations, the reliability of a semiconductor device having multilevel wiring layers can be improved while the performance thereof is maintained high.

DESCRIPTION OF THE PREFERRED EMBODIMENTS

Figure 1:
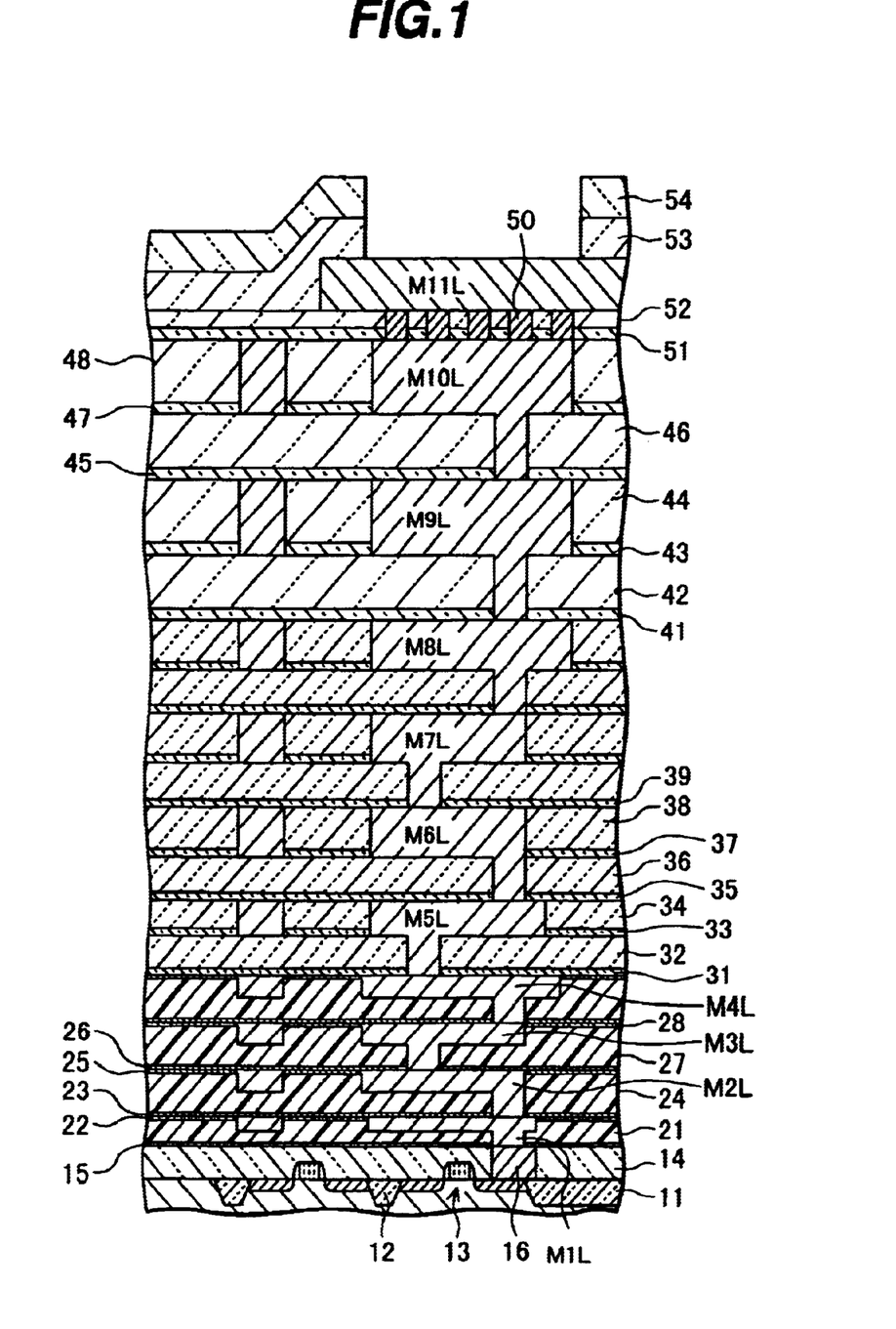
FIG. 1 is a schematic cross sectional view of a semiconductor device having multilevel wiring layers according to an embodiment of the invention.

FIG. 1 is a schematic cross sectional view of a semiconductor device having multilevel wiring layers according to an embodiment of the invention. In the surface layer of an Si substrate 11, an element separation region 12 is formed by shallow trench isolation (STI) and a number of semiconductor elements such as MOS transistors are formed. An undoped or phosphor (P) and/or boron (B) doped silicon oxide layer 14 is formed burying the semiconductor elements.

Contact holes are formed through the silicon oxide layer 14. A contact plug and/or a local interconnect 16 made of barrier metal, tungsten (W) and the like is buried in the contact holes. A Cu diffusion preventing and etch stopper layer 15 of SiC or the like is formed on the silicon oxide layer 14, covering the surface of the contact plug and/or local interconnect. On this Cu diffusion preventing and etch stopper layer 15, an organic insulating layer 21 of SiLK or the like having a low dielectric constant is formed. A hard mask layer 22 of SiC or the like is formed on the surface of the organic insulating layer 21.

Wiring trenches and via holes are formed in these insulating layers, and a barrier metal layer and a Cu layer are buried in these trenches and via holes to form a first wiring layer M1L. A Cu diffusion preventing and etch stopper layer 23 of SiC or the like is formed on the surface of the hard mask layer 22, covering the surface of the first wiring layer M1L. On the Cu diffusion preventing and etch stopper layer 23, an organic insulating layer 24 of SiLK having a low dielectric constant and a hard mask layer 25 of SiC or the like are stacked similar to the lower level layers. A second wiring layer M2L of Cu is buried in the organic insulating layer 24. On the hard mask layer 25, a third wiring layer M3L similar to the second wiring layer is formed by using a Cu diffusion preventing layer 26, a low dielectric organic insulating layer 27, a hard mask layer 28 and the third wiring layer M3L of barrier metal and Cu.

On the third wiring layer, a fourth wiring layer M4L having a similar structure is formed. On the fourth wiring layer M4L, a Cu diffusion preventing layer 31, an SiOC layer 32, an etch stopper layer 33 of SiC and an SiOC layer 34 are stacked and wiring trenches and via holes are formed. A barrier metal layer and a Cu layer are buried therein to form a fifth wiring layer M5L.

On the fifth wiring layer M5L, a Cu diffusion preventing layer 35, an SiOC layer 36, an SiC etch stopper layer 37 and an SiOC layer 38 are stacked and wiring trenches and via holes are formed. A barrier metal layer and a Cu layer are buried therein to form a sixth wiring layer M6L. Seventh and eighth wiring layers M7L and M8L having a similar structure are formed.

On the eighth wiring layer M8L, a Cu diffusion preventing layer 41, an silicon oxide layer 42, an SiC etch stopper layer 43 and an silicon oxide layer 44 are stacked and wiring trenches and via holes are formed. A barrier metal layer and a Cu layer are buried therein to form a ninth wiring layer M9L.

On the ninth wiring layer M9L, a Cu diffusion preventing layer 45 of SiC, a silicon oxide layer 46, a Cu diffusion preventing layer 47 and a silicon oxide layer 48 are stacked and wiring trenches and via holes are formed. A barrier metal layer and a Cu layer are buried therein to form a tenth wiring layer M10L.

On the tenth wiring layer M10L, a Cu diffusion preventing layer 51 of SiC and an insulating layer 52 of silicon oxide or the like are stacked and connection conductors 50 are buried penetrating through these insulating layers. An electrode layer of aluminum (Al) or the like is deposited and patterned to form an eleventh wiring layer M11L. A silicon oxide layer 53, a silicon nitride layer 54 and the like are stacked covering the eleventh wiring layer M11L. Openings are formed through the lamination of the silicon oxide layer 53 and silicon nitride layer 54 to expose the surfaces of pads.

Figure 2A:
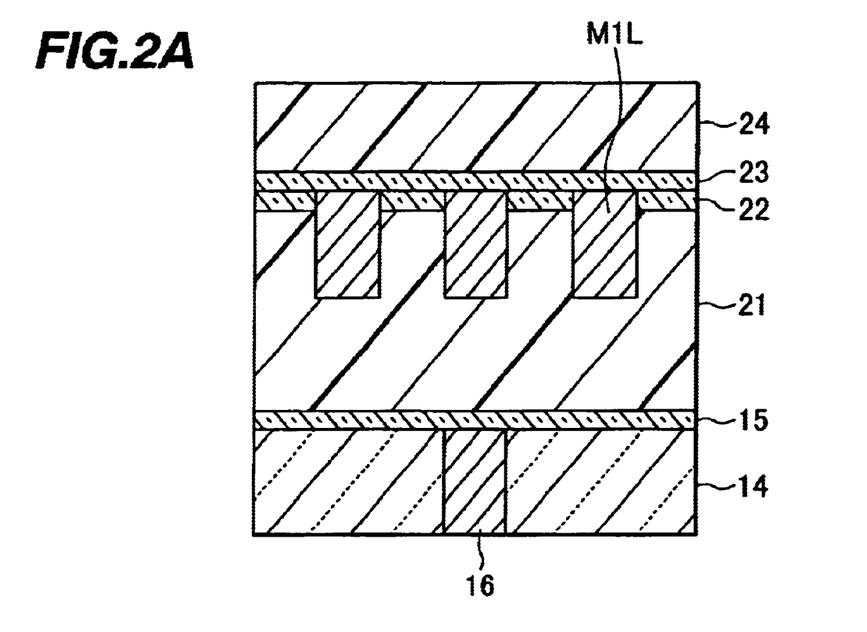
FIGS. 2A and 2B are schematic cross sectional views showing a partial structure of multilevel wiring layers.

FIG. 2A shows an example of the structure of the first wiring layer M1L. The distance between the conductive plug 16 and first wiring layer M1L is, for example, about 300 nm.

For example, the line width of the first wiring layer is 0.14 µm, the wiring pitch is 0.28 µm, and the wiring thickness is 250 nm. The SiC layer 15 has a dielectric constant of 4.5 and a thickness of 50 nm. The SiLK layer 21 has a dielectric constant of 2.7 and a thickness of 250 nm+200 nm. The SiC layer 22 has a dielectric constant of 4.5 and a thickness of 50 nm. The SiC layer 23 has a thickness of 50 nm.

Figure 2B:
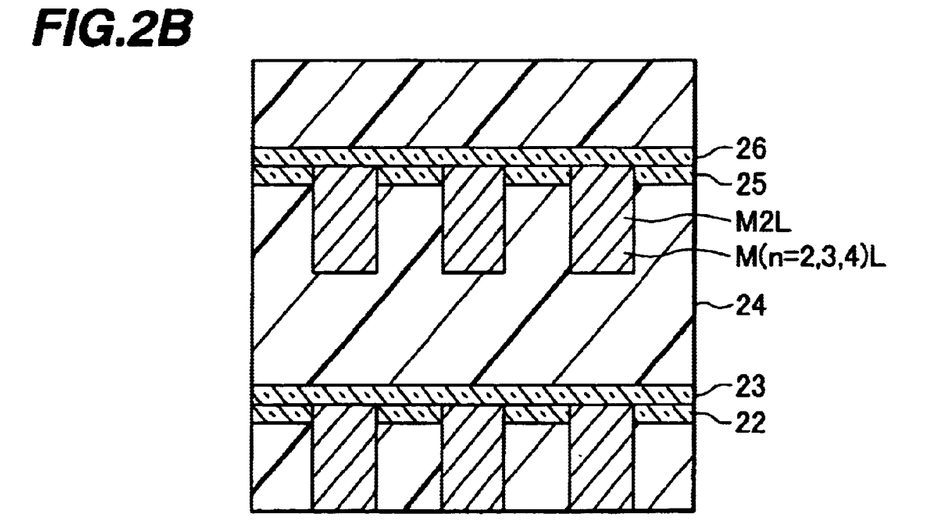

FIG. 2B shows an example of the structure of the second to fourth wiring layers M2L to M4L. For example, the SiC layer 23 of 50 nm thick, SiLK layer 24 of 450 nm thick and SiC layer 25 of 50 nm thick are stacked and the second (third, fourth) wiring layer M2(3, 4)L is buried. The wiring layer has a thickness of about 250 nm and both a line width and wiring pitch of about 0.14 µm. The distance to the lower level wiring layer is, for example, about 300 nm.

Figure 3A:
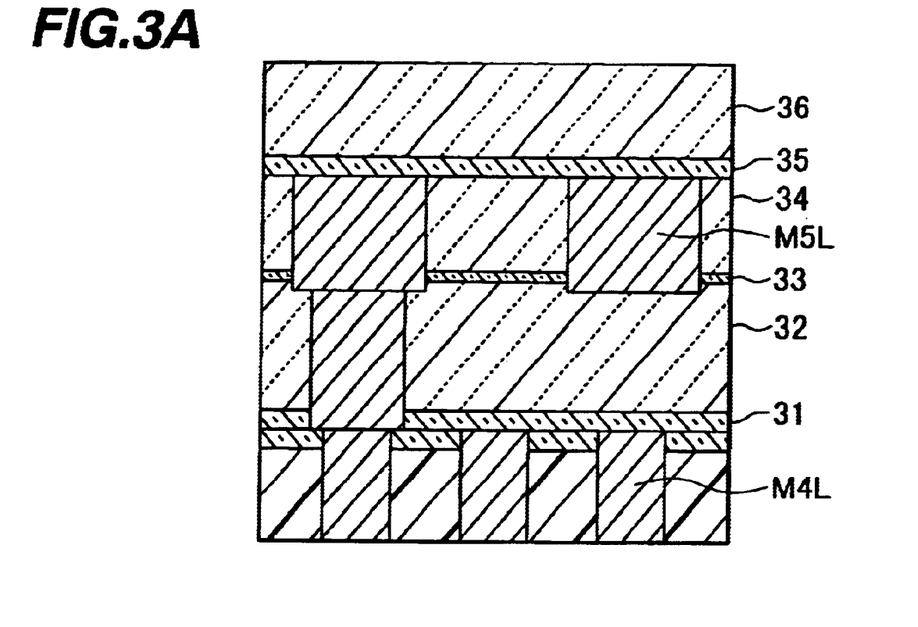
FIGS. 3A and 3B are schematic cross sectional views showing a partial structure of multilevel wiring layers.

FIG. 3A shows an example of the structure of the fifth wiring layer M5L. The SiC layer 31 having a thickness of about 70 nm, SiOC layer 32 having a thickness of about 350 nm, SiC layer 33 having a thickness of about 30 nm and SiOC layer 34 having a thickness of about 350 nm are stacked. A wiring trench is formed to a depth of about 400 nm from the surface of the laminated layer, and a via hole is formed to the remaining depth. A barrier metal layer and a Cu wiring layer are buried in the wiring trench and via hole to form the fifth wiring layer M5L. The SiC layer 35 is formed on the surface of the fifth wiring layer.

For example, the fifth wiring layer M5L has a height of about 400 nm, a wiring width is 0.28 µm and the wiring pitch is 0.56 µm, and a distance to the lower level wiring layer of about 400 nm.

Figure 3B:
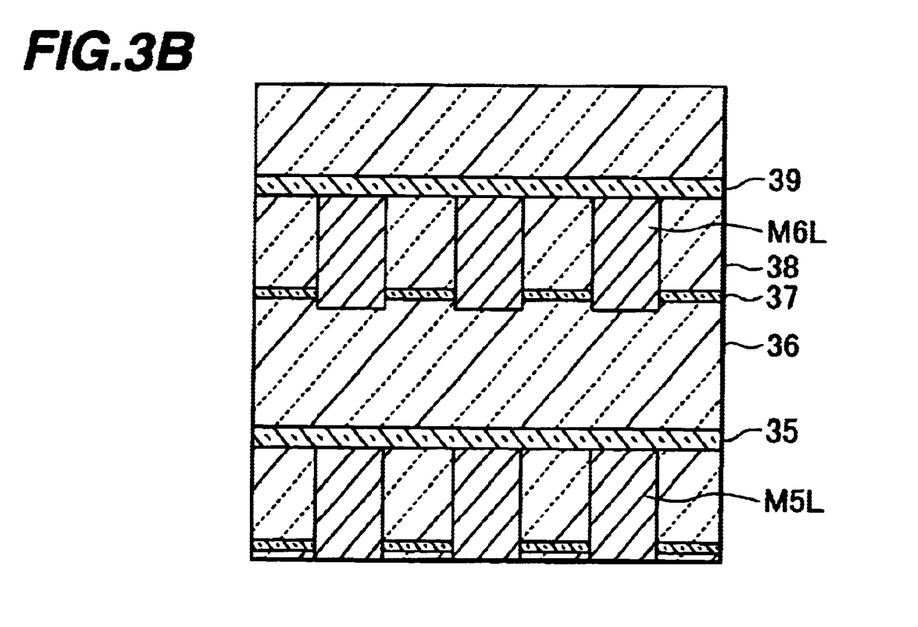

FIG. 3B shows an example of the structure of the sixth to eighth wiring layers M6L to M8L. This structure will be described by taking the sixth wiring layer as an example. On the fifth wiring layer M5L, the SiC layer 35 having a thickness of about 70 nm, SiOC layer 36 having a thickness of about 550 nm, SiC layer 37 having a thickness of about 30 nm and SiOC layer 38 having a thickness of about 350 nm are stacked.

A wiring trench is formed to a depth of 400 nm from the surface of the laminated layer and a via hole is formed through the remaining depth of 600 nm. A barrier metal layer and a Cu layer are buried in the wiring trench and via hole to form the sixth wiring layer M6L. The SiC layer 39 having a thickness of about 70 nm is formed covering the sixth wiring layer.

Figure 4:
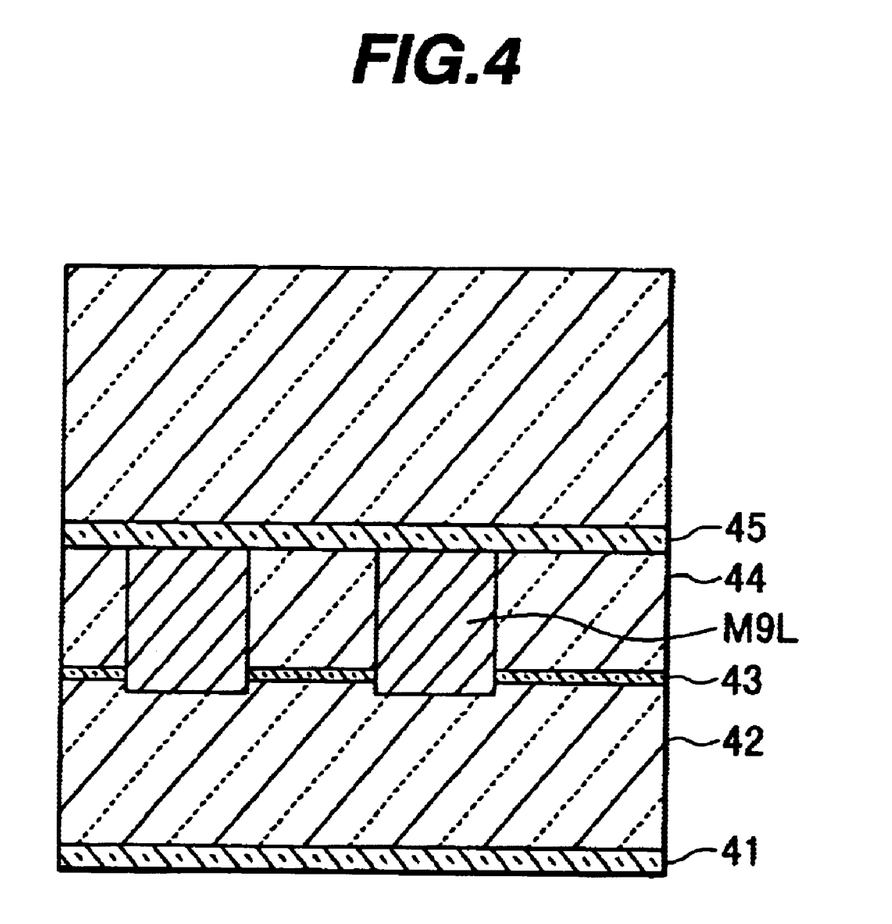
FIG. 4 is a schematic cross sectional view showing a partial structure of multilevel wiring layers.

FIG. 4 shows an example of the structure of the ninth and tenth wiring layers M9L and M10L. On the lower level wiring layer, the SiG layer 41 having a thickness of about 70 nm, silicon oxide film 42 having a thickness of about 550 nm, SiC layer 43 having a thickness of about 30 nm and silicon oxide layer 44 having a thickness of about 850 nm are stacked.

A wiring trench is formed to a depth of 900 nm from the surface of the laminated layer and a via hole reaching the lower level wiring is formed. A barrier metal layer and a Cu layer are buried in the wiring trench and via hole to form the ninth wiring layer M9L. The SiC layer 45 is formed covering the ninth wiring layer. The ninth wiring layer M9L has a height of about 900 nm and a wiring width is 0.42 µm and the wiring pitch is about 0.84 µm.

Reverting to FIG. 1, the structure of insulating layers of the multilevel wiring will be studied. In the studies, the Cu diffusion preventing layer, etch stopper layer, hard mask layer and the like are excluded. The interlayer insulating layers for the lower level wiring layer are made of an organic insulating layer of SiLK. The interlayer insulating layers for the upper level wiring layers of the ninth and tenth wiring layers M9L and M10L are made of a silicon oxide layer. The interlayer insulating layers for the middle level wiring layers from the fifth to eighth wiring layers M5L to M8L are made of an SiOC layer.

The thermal expansion coefficient, modulus of elasticity, density, hardness and the like of SiOC take intermediate values between silicon oxide and SiLK of an organic insulating film. As compared to the multilevel wiring structure having a silicon oxide layer formed directly on an organic insulating layer, if an interlayer insulating layer of SiOC is disposed between an organic insulating layer and a silicon oxide layer, the generation of stress and the like to be caused by a difference of a physical constant between the upper and lower level layers can be suppressed.

Figure 5:
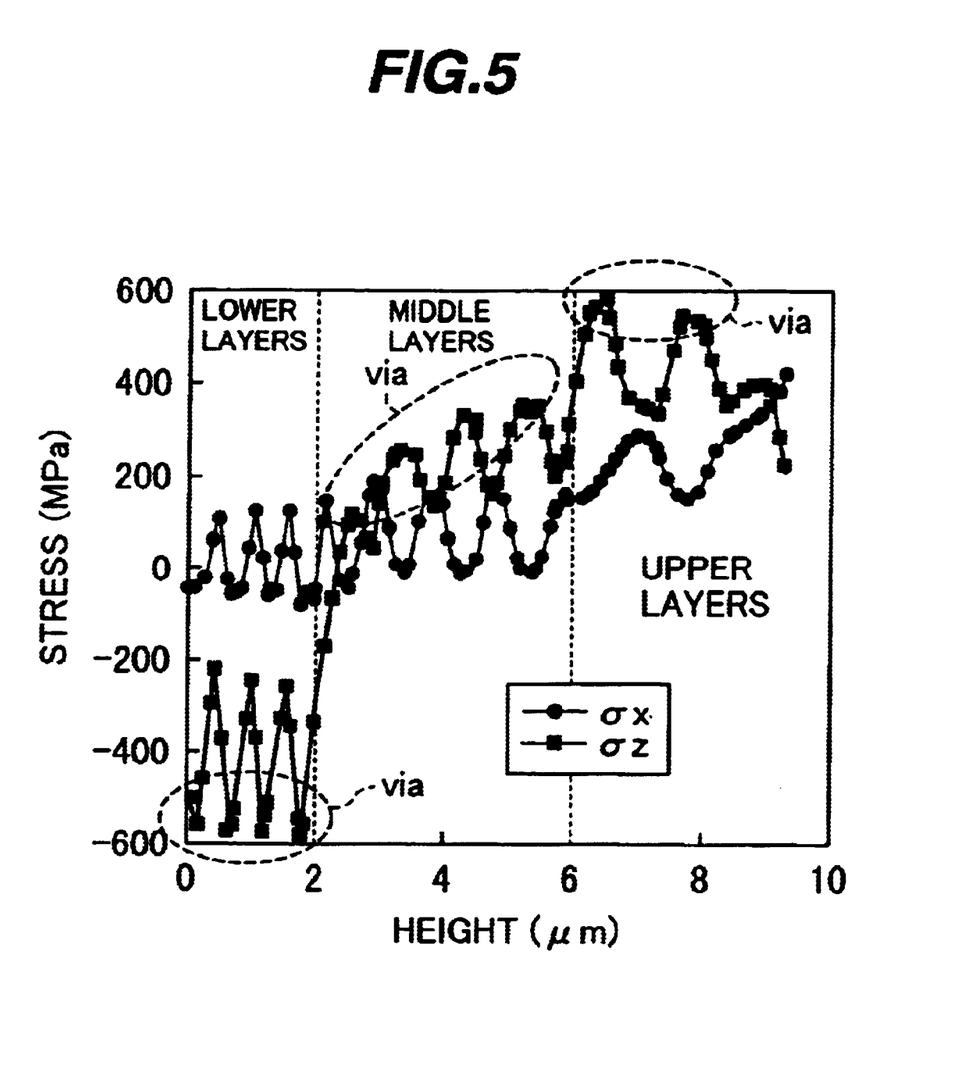
FIG. 5 is a graph showing stress generated in the multilevel wiring structure shown in FIG. 1 as a function of height.

FIG. 5 shows the calculation results of stress generated in the wiring layers shown in FIG. 1. A circle plot represents an in-plane stress and a square plot represents a stress along a plane normal direction. The abscissa represents a height of a wiring layer and the ordinate represents the magnitude of stress.

In the lower layers, the stress in the via hole along the normal direction takes a large minus value, and in the upper layers the stress in the via hole takes a large plus value. If these upper and lower layers are stacked directly, it is expected that a large stress difference is generated between the upper and lower layers. If SiOC middle layers are used as the interlayer insulating layers for multilevel wiring layers excluding the etch stopper layer and hard mask layer, a change in the stress can be relaxed as shown in FIG. 5.

Such relaxation of the stress may be ascribed to a gradual change in the dielectric constants of the lower, middle and upper interlayer insulating layers. This gradual change may also be applied to the effective dielectric constant of a plurality of insulating layers including the etch stopper layer and hard mask layer.

In the structure shown in FIG. 1, the same insulating material is used for each wiring layer, excepting the etch stopper layer and hard mask layer. The two insulating layers on an intermediate thin layer as an etch stopper layer disposed between the two layers are made of the same material. The insulating layer at the side of a wiring pattern and the insulating layer at the side of a via conductor may be made of different materials.

Figure 6:
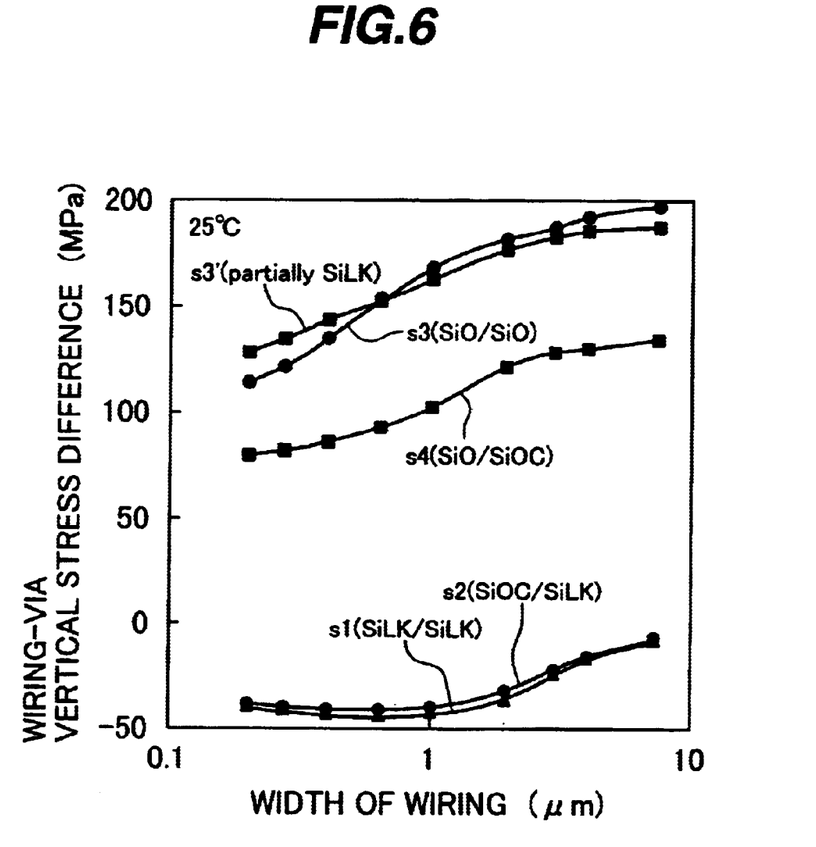
FIG. 6 is a graph showing a vertical stress difference between a wiring pattern and a via conductor formed in stacked insulating layers made of various materials.

FIG. 6 shows vertical stress differences between a wiring pattern and a via conductor when the insulating layer in which the wiring pattern is buried and the insulating layer in which the via conductor is buried are made of various materials. The abscissa represents a wiring width in the unit of µm and the ordinate represents a vertical stress difference between a wiring pattern and a via conductor in the unit of MPa. The larger the stress difference is, the higher the possibility of defects in the wiring becomes.

A curve s1 indicates a stress difference when the insulating layer on the upper surface of a wiring pattern is an organic insulating layer of SiLK, and the insulating layers at the side of a wiring pattern and at the side of a via conductor are organic insulating layers of SiLK. A curve s2 indicates a stress difference when the insulating layer at the upper level of a wiring pattern is made of SiOC and the insulating layers at the side of a wiring pattern and at the side of a via conductor are organic insulating layers of SiLK. A curve s3 indicates a stress difference when the insulating layer at the upper level of a wiring pattern and the insulating layer at the side of a wiring pattern and at the side of a via conductor are made of silicon oxide. A curve s3' indicates a stress difference when a portion of the insulating layer in which a wiring layer is buried is made of SiLK. A curve s4 indicates a stress difference when the insulating layer at the upper surface of a wiring pattern is made of silicon oxide and the insulating layers at the side of a wiring pattern and at the side of a via conductor are made of SiOC.

The stress difference when the insulating layer burying a wiring layer is made of SiLK is greatly different from the stress difference when the insulating layer burying a wiring layer is made of silicon oxide. A middle value between these two stress differences corresponds to the stress difference when the insulating layer burying the wiring pattern is made of silicon oxide and the insulating layer burying the via conductor is made of SiOC.

Figure 7A:
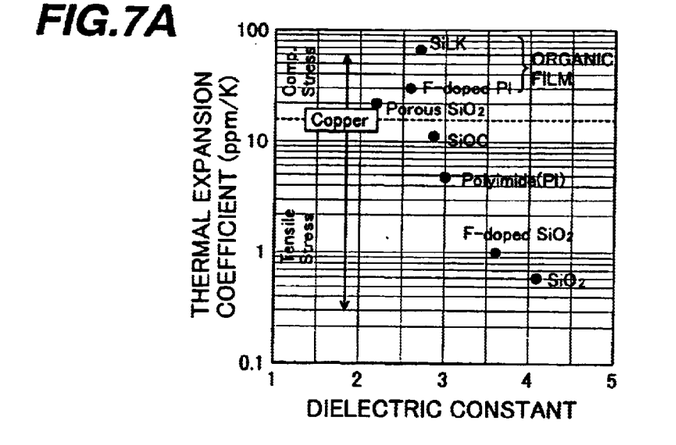
FIGS. 7A, 7B and 7C are graphs showing a relation between physical constants and a dielectric constant of various insulating materials.
Figure 7B:
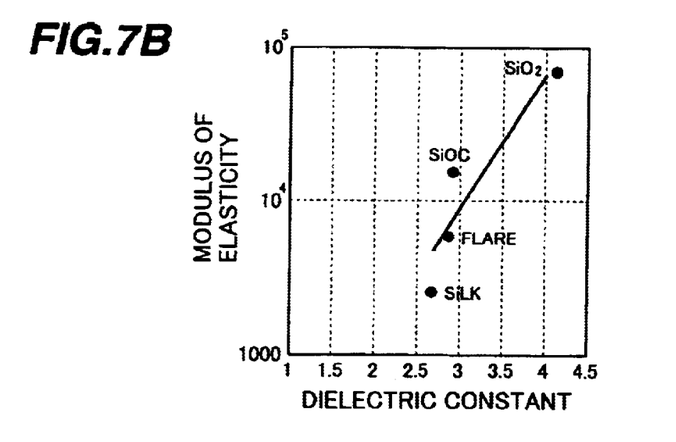
Figure 7C:
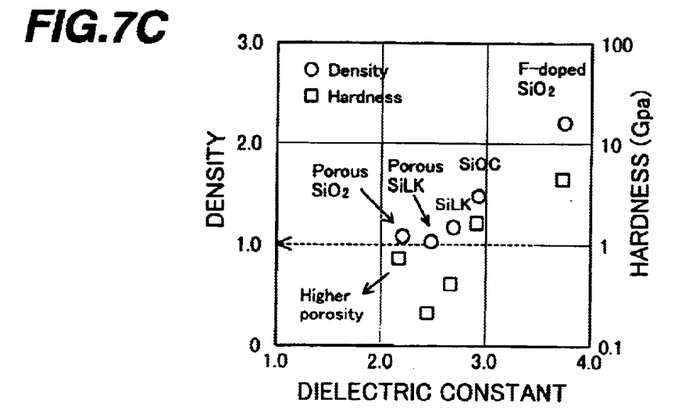

It can be understood that the stress difference can be made small by disposing, between the upper and lower wiring layers, an interlayer insulating films having the mixed characteristics of the interlayer insulating layers for the upper and lower wiring layers. FIGS. 7A, 7B and 7C show the physical constants of various insulating materials. The abscissa represents a dielectric constant, the ordinate in FIG. 7A represents a thermal expansion coefficient, the ordinate in FIG. 7B represents a modulus of elasticity, and the ordinate in FIG. 7C represents a density and a hardness.

As shown in FIG. 7A, the dielectric constant is approximately in reverse proportion to the thermal expansion coefficient. As the dielectric constant lowers, the thermal expansion coefficient becomes high. Organic insulating materials such as SiLK and F-doped polyimide have a high thermal expansion coefficient. Porous silicon oxide also has a high thermal expansion coefficient. Namely, insulating materials having a low dielectric constant have a high thermal expansion coefficient. As compared to these materials, the thermal expansion coefficient of silicon oxide is lower by one digit or more. There is the tendency that the thermal expansion coefficient increases in the order of silicon oxide, F-doped silicon oxide, polyimide and SiOC.

FIG. 7B shows the relation between a dielectric constant and a modulus of elasticity. There is the tendency that as the dielectric constant lowers, the modulus of elasticity lowers exponentially. FIG. 7C shows the relation between a dielectric constant and a density and the relation between a dielectric constant and a hardness. A circle plot represents the density and a square plot represents a hardness. Two plots in the vertical direction represent the same material having the same dielectric constant. There is the tendency that as the dielectric constant lowers, the density lowers generally linearly. As the dielectric constant lowers, the hardness lowers exponentially.

In summary, the graphs shown in FIGS. 7A, 7B and 7C indicate that the physical constants excepting the dielectric constant have a tight relation with the dielectric constant. Namely, if a different physical constant is selected, the other physical constants take different values. This tendency is the same for all physical constants. Therefore, even if the thermal expansion coefficient, modulus of elasticity, density, hardness or the like is used instead of the dielectric constant as the index for material selection, approximately the same results can be obtained.

As compared to silicon oxide, the materials having a considerably low dielectric constant also have a large difference in the physical constants such as thermal expansion coefficient, modulus of elasticity, density and hardness. If materials having a large physical constant difference are stacked directly, a large stress difference is applied to the materials, which may become the cause of peeling, cracks, lowered tightness and the like. In such a case, an insulating film having an intermediate physical constant is inserted between the two materials so that the generated stress may be relaxed.

If layers having different physical constants are laminated as shown in FIG. 6, the whole lamination structure having the intermediate physical constant can be expected. Therefore, if a plurality of different insulating layers are laminated, the intermediate physical constant can be expected.

If an interlayer insulating layer is made of a plurality of layers, an average value of the physical constants of the layers may be used as an effective physical constant. A physical constant viewed from the wiring can be used as an effective physical constant of the interlayer insulating layer. If the same material is used for the etch stopper layer and the hard mask layer in the multilevel wiring structure, the effective physical constant of the interlayer insulating layers may be calculated by excluding the etch stopper layer and hard mask layer.

The present invention has been described in connection with the preferred embodiments. The invention is not limited only to the above embodiments. It is apparent that various modifications, improvements, combinations, and the like can be made by those skilled in the art.

What we claim are:

1. A semiconductor device comprising:
   a semiconductor substrate;
   a number of semiconductor elements formed on said semiconductor substrate;
   a plurality of lower level wiring layers electrically connected to said semiconductor elements;
   a plurality of first insulating layers electrically separating said lower level wiring layers and having a first dielectric constant;
   a plurality of middle level wiring layers electrically connected to said lower level wiring layers;
   a plurality of second insulating layers electrically separating said middle level wiring layers and having a second dielectric constant larger than the first dielectric constant;
   a plurality of upper level wiring layers electrically connected to said middle level wiring layers;
   a plurality of third insulating layers electrically separating said upper level wiring layers and having a third dielectric constant larger than the second dielectric constant.

2. A semiconductor device according to claim 1, wherein said third insulating layers include silicon oxide layers.

3. A semiconductor device according to claim 2, wherein said first insulating layers include organic insulating layers or porous silicon oxide layers.

4. A semiconductor device according to claim 3, wherein said second insulating layers include silicon oxycarbide.

5. A semiconductor device according to claim 4, wherein said lower level, middle level and upper level wiring layers are made of copper.

6. A semiconductor device according to claim 5, wherein each of said first, second and third insulating layers is made of a lamination of a plurality of insulating layers and each of the first, second and third dielectric constants is an effective dielectric constant of the lamination for a corresponding one of said wiring layers.

7. A semiconductor device according to claim 6, wherein the lamination of a plurality of insulating layers includes a silicon nitride layer or a silicon carbide layer.

8. A semiconductor device according to claim 7, wherein the lamination of said first insulating layer includes a silicon carbide layer and the lamination of said second insulating layer includes a silicon carbide layer or a silicon nitride layer.

9. A semiconductor device according to claim 8, wherein said lower level wiring layers include wiring lines having a line width of 0.1 μm or narrower.

10. A semiconductor device according to claim 1, wherein said third insulating layers include silicon oxide layers and said second insulating layers include silicon oxycarbide.

11. A semiconductor device according to claim 1, wherein said first insulating layers include organic insulating layers or porous silicon oxide layers and said second insulating layers include silicon oxycarbide.

12. A semiconductor device according to claim 11, wherein the lamination of said first insulating layer includes a silicon carbide layer and the lamination of said second insulating layer includes a silicon carbide layer or a silicon nitride layer.

13. A semiconductor device comprising:

a semiconductor substrate;

a number of semiconductor elements formed on said semiconductor substrate;

a first wiring layer electrically connected to said semiconductor elements;

a first insulating layer electrically separating said first wiring layer and having a first dielectric constant;

a second wiring layer electrically connected to said first wiring layer;

a second insulating layer electrically separating said second wiring layer and having the first dielectric constant;

a third wiring layer electrically connected to said second wiring layer;

a third insulating layer electrically separating said third wiring layer and having the first dielectric constant;

a fourth wiring layer electrically connected to said third wiring layer;

a fourth insulating layer electrically separating said fourth wiring layer and having a second dielectric constant larger than the first dielectric constant;

a fifth wiring layer electrically connected to said fourth wiring layer; and a fifth insulating layer electrically separating said fifth wiring layer and having a third dielectric constant larger than the second dielectric constant.

14. A semiconductor device according to claim 13, wherein said fifth insulating layer is made of silicon oxide.

15. A semiconductor device according to claim 13, wherein said first, second and third insulating layers are made of organic insulator or porous silicon oxide.

16. A semiconductor device according to claim 15, wherein said fourth insulating layer is made of silicon oxycarbide.

17. A semiconductor device comprising:

a semiconductor substrate;

a number of semiconductor elements formed on said semiconductor substrate;

a plurality of lower level wiring layers electrically connected to said semiconductor elements;

a plurality of middle level wiring layers electrically connected to said lower level wiring layers;

a plurality of upper level wiring layers electrically connected to said middle level wiring layers;

a plurality of first insulating layers electrically separating said lower level wiring layers and having a first physical constant;

a plurality of third insulating layers electrically separating said upper level wiring layers and having a third physical constant different from the first physical constant;

a plurality of second insulating layers electrically separating said middle level wiring layers and having a second physical constant having an intermediate value between the first and third physical constants.

18. A semiconductor device according to claim 17, wherein said third insulating layers are made of silicon oxide.

19. A semiconductor device according to claim 17, wherein said first insulating layers are made of organic insulator or porous silicon oxide.

20. A semiconductor device according to claim 17, wherein said second insulating layers are made of silicon oxycarbide.

* * * * *